（12） United States Patent
Park et al.

(10) Patent No.: US 8,854,101 B2
(45) Date of Patent: Oct. 7, 2014

(54) ADAPTIVE CLOCK GENERATING APPARATUS AND METHOD THEREOF

(71) Applicant: Korea University Research and Business Foundation, Seoul, KS (US)

(72) Inventors: Jong Sun Park, Seoul (KP); Woo Jin Rim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 62 days.

(21) Appl. No.: 13/763,097

(22) Filed: Feb. 8, 2013

(65) Prior Publication Data

US 2013/0222018 A1    Aug. 29, 2013

(30) Foreign Application Priority Data

Feb. 24, 2012    (KR) ........................ 10-2012-0018814

(51) Int. Cl.
     *H03K 3/00*      (2006.01)
     *H03L 7/08*      (2006.01)
     *G06F 1/10*      (2006.01)
     *H03K 5/00*      (2006.01)

(52) U.S. Cl.
     CPC ................ *H03L 7/0802* (2013.01); *G06F 1/10* (2013.01); *H03K 5/00006* (2013.01)
     USPC ........................................... 327/291; 327/299

(58) Field of Classification Search
None
See application file for complete search history.

(56) References Cited

U.S. PATENT DOCUMENTS

| | | | | |
|---|---|---|---|---|
| 5,140,284 | A | * | 8/1992 | Petersson et al. ................ 331/25 |
| 5,821,786 | A | * | 10/1998 | Nozuyama et al. ........... 327/141 |
| 6,313,622 | B1 | * | 11/2001 | Seki et al. ................... 324/76.82 |
| 6,414,527 | B1 | * | 7/2002 | Seno et al. ..................... 327/158 |
| 8,362,642 | B2 | * | 1/2013 | Zerbe et al. ..................... 307/43 |
| 2011/0175658 | A1 | * | 7/2011 | Nomura ........................ 327/261 |
| 2011/0199159 | A1 | * | 8/2011 | Rozen et al. ................... 331/74 |
| 2012/0044005 | A1 | * | 2/2012 | Chawla et al. ................ 327/299 |

FOREIGN PATENT DOCUMENTS

| | | |
|---|---|---|
| KR | 10-0514414 B1 | 9/2005 |
| KR | 10-0945793 B1 | 3/2010 |

* cited by examiner

*Primary Examiner* — Tuan T Lam
(74) *Attorney, Agent, or Firm* — McDermott, Will and Emery LLP

(57) ABSTRACT

An adaptive clock generating apparatus is provided. The apparatus includes a fixed frequency divider, a replica, a counter, a variable frequency divider. The adaptive clock generating apparatus generates a clock whose period varies along with changes in the critical path delay of a synchronous circuit.

12 Claims, 7 Drawing Sheets

ADAPTIVE CLOCK GENERATING APPARATUS AND METHOD THEREOF

CROSS-REFERENCE TO RELATED APPLICATION

This application claims the benefit of Korean Patent Application No. 2012-0018814 filed on Feb. 24, 2012, which is incorporated herein by reference.

FIELD OF THE INVENTION

The present disclosure relates to an adaptive clock generating apparatus and a method thereof.

BACKGROUND OF THE INVENTION

In recent, with the explosive growth of the market for mobile electronic devices using batteries, demands for digital circuits requiring less power consumption are increasing.

Power consumption of a digital circuit can be reduced by lowering its supply voltage. Upon usage, lowering the supply voltage to a level less than or near the threshold voltage of the semiconductor can minimize the power consumption of the circuit.

However, there is a problem in a sub/near-threshold operation that the performance of the circuit varies substantially compared to that in a super-threshold operation due to process variations, voltage fluctuations, and temperature variations. The variation of the circuit performance results in issues in determining the circuit's clock signal frequency.

The maximum speed of a digital circuit is determined by the critical path delay which is the longest delay of combinational circuits of the circuit. The period of the applied clock signal should be always longer than the critical path delay, or the circuit may malfunction. As a result, it will degrade the yield of the designed chip.

The simplest way to prevent the malfunctioning of the circuit is to stretch the period of the clock sufficiently. The cycle of the clock has to be set to the longest delay, i.e., critical path delay, considering the worst case variation.

However, such an approach greatly increases energy consumption. Since the period of the clock is set to the worst case, most circuits are usually in the idle state after finishing necessary operations, because the circuits are still left with as much time as the difference between the period of the clock and the actual critical path delay.

Even during that remaining time, a certain amount of current is still leaking. Due to the energy consumed by the active leakage current, the goal to design a low power circuit is not sufficiently satisfied. Since the circuit does not operate as fast as the potential speed of the circuit, time and other resources are wasted.

As described above, the problems of the malfunctioning of the circuit or the waste of energy become more serious as the supply voltage becomes lower due to temperature variation, variation of a supply voltage, and so on. Accordingly, there is a demand for a circuit and a method for generating an adaptive clock, which is capable of minimizing the time during which a circuit is in the idle state, by optimally adjusting a cycle of the clock depending on operation circumstances, so as to reduce energy consumption while not incurring malfunction.

With respect to a delay circuit for increasing a cycle of a clock, Korean Patent No. 10-0514414 describes a delay synchronized loop (DDL) circuit.

Korean Patent No. 10-0945793 also describes a delay synchronized loop (DDL) circuit.

An objective of the present disclosure is to provide an adaptive clock generating apparatus and a method thereof, which dynamically set the period of a clock along with changes in critical path delay of a synchronous circuit, so as to minimize energy consumption while preventing a clock synchronization error of a circuit.

BRIEF SUMMARY OF THE INVENTION

One aspect of the present inventive concept provides an adaptive clock generating apparatus. The apparatus includes a fixed frequency divider that receives a reference clock, and outputs a clock signal having a period corresponding to an integer multiple of the period of the reference clock. The apparatus also includes a replica that receives the clock signal output by the fixed frequency divider, and outputs a clock signal that is delayed as long as critical path delay of a synchronous circuit. The apparatus also includes a counter that receives an enable signal and a reset signal, which are generated based on the signals output by the fixed frequency divider and the replica, further receives the reference clock as its clock signal, and counts the number of cycles of the reference clock while the counter is enabled. The apparatus also includes a variable frequency divider that, based on the number of cycles of the reference clock, generates a clock signal having a period corresponding to an integer multiple of the number of cycles of the reference clock, the integer being greater by 1 than the number of cycles of the reference clock. The adaptive clock generating apparatus generates a clock whose period varies along with changes in the critical path delay of the synchronous circuit.

Another aspect of the present inventive concept provides an adaptive clock generating method. The method receives a reference clock and detects changes in critical path delay of a synchronous circuit. The method counts the number of cycles of the reference clock during the critical path delay to determine how many cycles of the reference clock spent on the critical. The method generates a clock signal having a period corresponding to an integer multiple of the period of the reference clock. The integer is greater by 1 than the number of cycles of the reference clock. The adaptive clock generating method generates a clock whose period varies along with changes in the critical path delay of the synchronous circuit.

An adaptive clock generating apparatus and a method thereof in accordance with an illustrative embodiment of the present inventive concept can minimize energy consumption while preventing a clock synchronization error of a circuit by dynamically setting the period of the clock along with changes in the critical path delay of the synchronous circuit.

An aspect of the present inventive concept improves production efficiency of the digital circuits operating at near/sub-threshold supply voltage. Because an adaptive clock generating apparatus and a method thereof in accordance with an illustrative embodiment of the present inventive concept can preventing malfunction of a digital circuit even when a semiconductor manufacturing process environment is changed, through a detection circuit and a control circuit, which are equipped in an integrated circuit itself.

Another aspect of the present inventive concept can improve product reliability by adaptively generating the clock frequency where operation conditions of a product such as supply voltage or operating temperature vary.

Yet another aspect of the present inventive concept can improve both production efficiency and operation efficiency. This is because simple elements such as a counter are used to calculate the best clock period.

Still another aspect of the present inventive concept lets a synchronous circuit operate as fast as possible as long as it does not malfunction.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
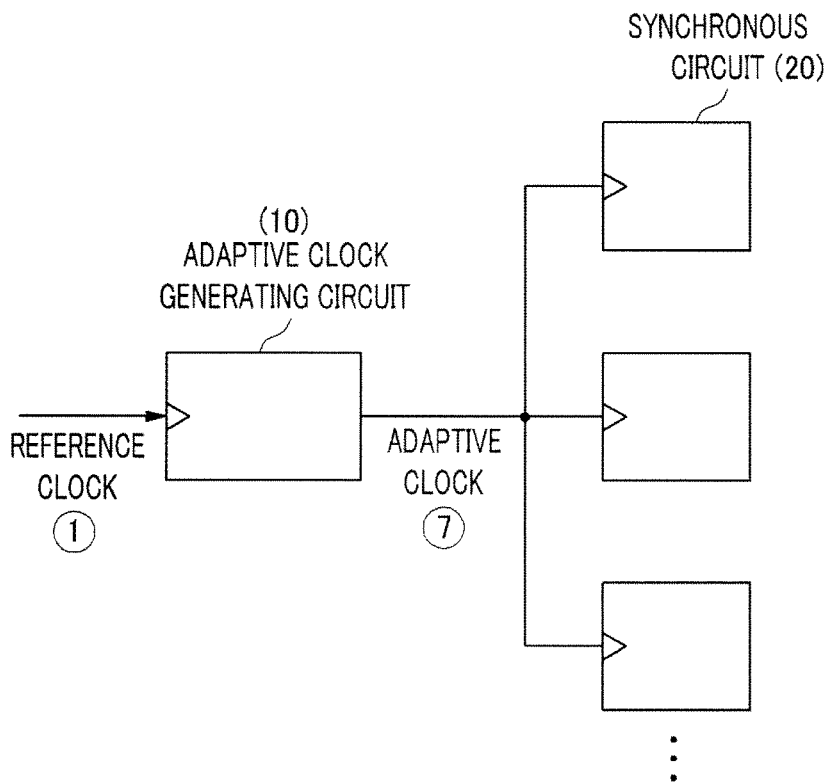
FIG. 1 illustrates an example system to which an adaptive clock generating apparatus in accordance with an illustrative embodiment of the present inventive concept is applied.

Hereinafter, illustrative embodiments will be described in detail with reference to the accompanying drawings so that inventive concept may be readily implemented by those skilled in the art. However, it is to be noted that the present disclosure is not limited to the illustrative embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element. Further, the term "comprises or includes" and/or "comprising or including" used in the document means that one or more other components, steps, operations, and/or the existence or addition of elements are not excluded in addition to the described components, steps, operations and/or elements.

FIG. 1 illustrates an example system to which an adaptive clock generating apparatus in accordance with an illustrative embodiment of the present inventive concept is applied.

An adaptive clock generating apparatus 10 in accordance with an illustrative embodiment of the present inventive concept receives input of a reference clock 1 and outputs an adaptive clock 7. The adaptive clock 7 is applied to at least one synchronous circuit 20 requiring clock synchronizing instead of the reference clock 1. As described above, the adaptive clock 7 is generated to have the best period so that a clock synchronizing error can be avoided and energy consumption can be minimized. This will be explained with reference to FIGS. 2 and 3.

Figure 2:
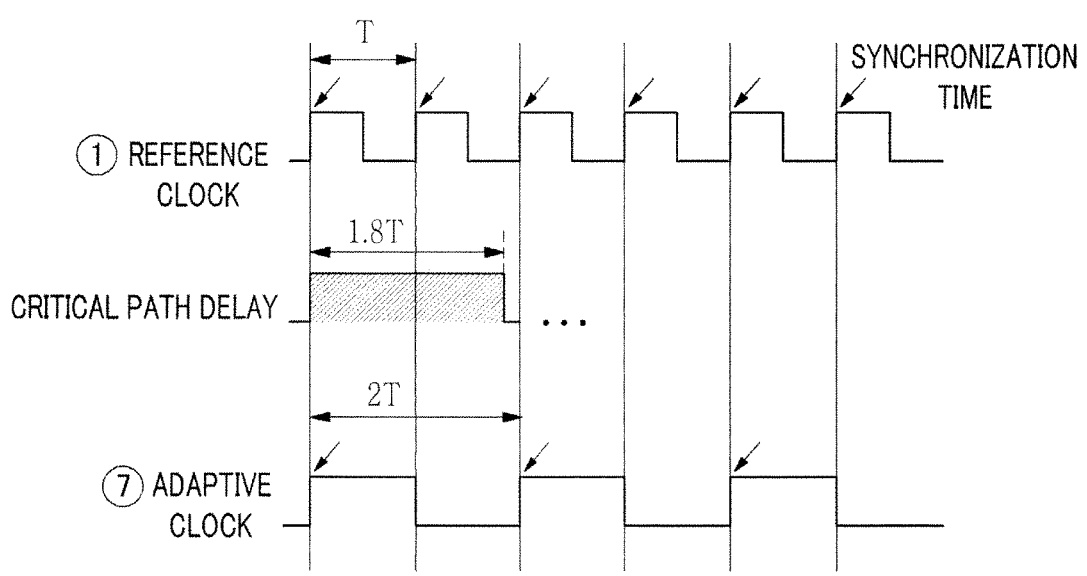
FIGS. 2 and 3 illustrate explanatory timing diagrams in accordance with an illustrative embodiment of the present inventive concept.
Figure 3:
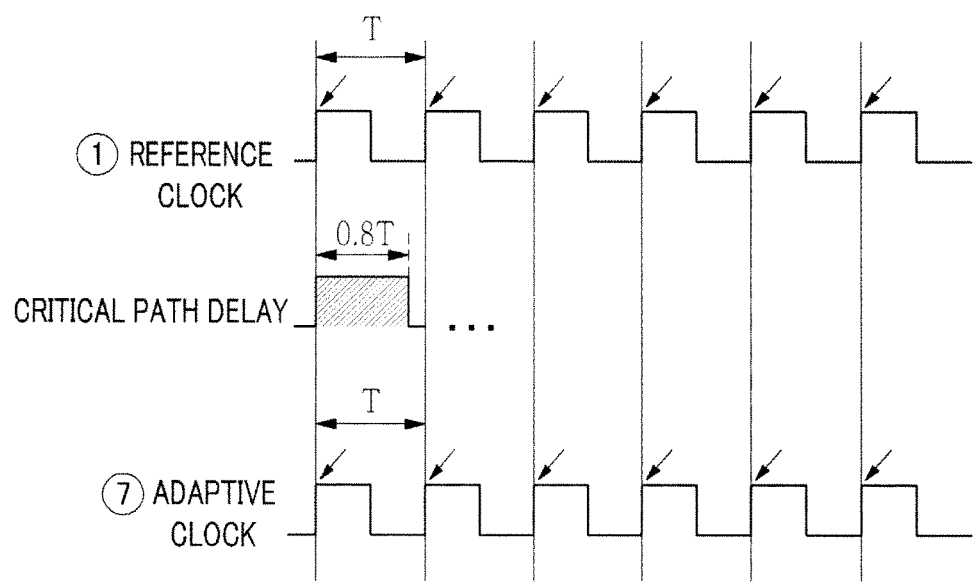

FIGS. 2 and 3 illustrate explanatory timing diagrams in accordance with an illustrative embodiment of the present inventive concept.

In FIG. 2, the cycle period of the reference clock 1 is T, and synchronization occurs at each ascent edge of the clock. When detected critical path delay of the synchronous circuit 20 is 1.8T, the adaptive clock generating apparatus in accordance with an illustrative embodiment of the present inventive concept generates the adaptive clock 7 having a period of 2T.

Like the illustrated example, when the critical path delay of the synchronous circuit 20 exceeds the period T of the reference clock 1, if the reference clock 1 continues to be applied to the synchronous circuit 20, a synchronizing error occurs thereby resulting in malfunction of the circuit. Therefore, a clock having a longer cycle than 1.8T, which is the critical path delay, should be applied.

However, if the cycle of the clock to be applied is too long, energy is wasted. Therefore, the shortest period longer than the critical path delay is optimal. Since the adaptive clock 7 is the clock applied to the synchronous circuit 20 in lieu of the reference clock 1, it is desirable that the adaptive clock 7 has a period corresponding to an integer multiple of the period of the reference clock 1.

Accordingly, the adaptive clock generating apparatus in accordance with an illustrative embodiment of the present inventive concept calculates the smallest integer that can be used to stretch the reference clock 1 to have a longer period than the detected critical path delay. In the illustrated example, the critical path delay is 1.8T. The smallest integer but larger than 1.8 is 2. Thus, the adaptive clock 7 having a period of 2T is generated.

FIG. 3 illustrates a case where the detected critical path delay is 0.8T, which is therefore shorter than the period of the reference clock 1.

In this case, since the critical path delay is shorter than the period of the reference clock 1, the period of the clock does not need to be increased. Accordingly, the generated adaptive clock 7 has the same cycle T as the cycle of the reference clock 1. However, the adaptive clock generating apparatus 10 in accordance with an illustrative embodiment of the present inventive concept does not independently consider such cases and just equally applies the above-described rule. This makes the circuit structure of the adaptive clock generating apparatus 10 in accordance with an illustrative embodiment of the present inventive concept simple.

That is, the example shown in FIG. 3 is also subject to the rule of generating a clock having a period that corresponds to the smallest integer multiple of the period of the reference clock 1 but is longer than the detected critical path delay. In the illustrated example, since the smallest integer larger than 0.8 is 1, the adaptive clock 7 that is generated has a cycle T, which can be obtained by multiplying T by 1.

As shown in the examples of FIGS. 2 and 3, the adaptive clock generating apparatus 10 in accordance with an illustrative embodiment of the present inventive concept dynamically calculates the best period based on the currently detected critical path delay. As described above, just fixing the period of the clock to the worst case critical path delay wastes time and energy resources. For example, when the critical path delay in the worst case is 3.3T, the period of the clock should be fixed to at least 4T. Thus, in the case shown in FIG. 2, the circuit should be in the idle state for as long as 2T. And in the case of FIG. 3, the circuit is in the idle state for as long as 3T.

In contrast, the adaptive clock generating apparatus 10 in accordance with an illustrative embodiment of the present inventive concept dynamically determines the best period under the current operation situation based on not the worst critical path delay but the detected critical path delay at present. Thus, the adaptive clock generating apparatus 10 in accordance with an illustrative embodiment of the present inventive concept allows the synchronous circuit 20 to operate without wasting energy and time.

Figure 4:
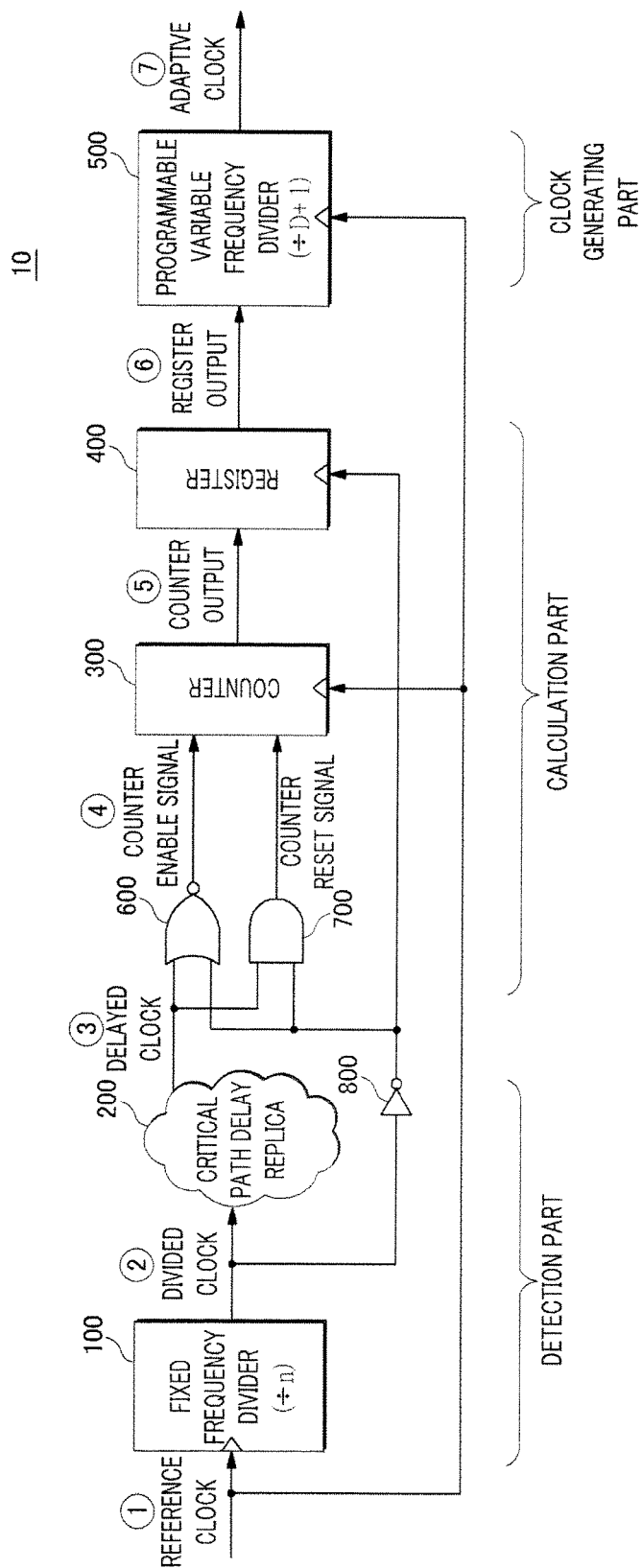
FIG. 4 illustrates an adaptive clock generating apparatus in accordance with an illustrative embodiment of the present inventive concept.

FIG. 4 illustrates an adaptive clock generating apparatus in accordance with an illustrative embodiment of the present inventive concept.

A fixed frequency divider 100 and a critical path delay replica 200 detect changes in the critical path delay. A counter 300 calculates the time difference from the cycle period of the reference clock 1. A variable frequency divider 500 receives the time difference via a register 400 and generates the adaptive clock 7 based on the time difference.

The fixed frequency divider 100 receives the reference clock 1 and outputs a divided clock 2, which is a clock signal having a period corresponding to an integer multiple of the period of the reference clock 1. In the drawing, (÷n) means it is a frequency divider which outputs a clock having a period obtained by multiplying the period of the input clock by an integer n. For example, ÷128 means that the period of the output clock is 128 times the period of the input clock. That is, when the period of the reference clock 1 is T, the period of the divided clock 2 is nT. Here, the value n is not important and has only to be greater than 64.

The replica 200 receives the divided clock 2 and outputs a delayed clock 3, which is a clock signal that has been delayed as long as the critical path delay of the synchronous circuit 20. Accordingly, the delayed clock 3 has the same period of the divided clock 2 period of nT but has a time difference as much as the critical path delay from the divided clock 2. By using the time difference, the adaptive clock generating apparatus 10 in accordance with an illustrative embodiment of the present inventive concept can detect changes in the critical path delay.

The divided clock 2 and the delayed clock 3 are used to generate an enable signal 4 and a reset signal of the counter 300. As illustrated, the enable signal 4 is generated by inputting the inverted signal 800 of the divided clock 2 and the delayed clock 3 to a NOR gate 600. The reset signal is generated by inputting the inverted signal 800 of the divided clock 2 and the delayed clock 3 to an AND gate 700.

Of course, as long as outcome is the same, it is possible to make the configuration of the circuit that generates the enable signal and the reset signal different from that in the drawing. For example, the enable signal 4 may be generated by inputting the inverted (NOT) signal of the divided clock 2 and the delayed clock 3 to an AND gate instead of the NOR gate.

What is important is that the counter 300 is enabled during the time difference between the divided clock 2 and the delayed clock 3, i.e., the critical path delay of the synchronous circuit 20. In other words, the counter 300 is enabled at an ascent edge of the divided clock 2, and the enable state is maintained during the critical path delay. Since the counter 300 receives the reference clock 1 as its clock, the counter 300 gets to count the number of cycles of the reference clock 1 while enabled, and in turn, to calculate the integer multiple of the period of the reference clock 1 than which the critical path delay becomes longer.

For example, the counter 300 outputs 1 in the example of FIG. 2 wherein the critical path delay is 1.8T, and 0 in the example of FIG. 3 wherein the critical path delay is 0.8T.

The counter 300 is reset at a descent edge of the divided clock 2. Since the register 400 connected to the counter 300 receives the inverted signal 800 of the divided clock 2 as its clock, the register 400 stores the value calculated by the counter 300 when the counter 300 is reset, and at the same time, outputs the value to the variable frequency divider 500.

In the drawing, (÷D +1) of the variable frequency divider 500 means that when its input value is an integer D, its output is a signal having a period D +1 times longer than the period of the input clock. In the configuration of the illustrative embodiment, the input clock is the reference clock 1, and the input value is the register output 6, i.e., the counter output 5. Accordingly, D+1 is a value obtained by adding 1 to the counter output 5.

For example, in the example of FIG. 2 wherein the critical path delay is 1.8T, the counter output 5 is 1. In this case, the variable frequency divider 500 outputs a clock having a period of 2T. In the example of FIG. 3 wherein the critical path delay is 0.8T, the counter output 5 is 0. In this case, the variable frequency divider 500 outputs a clock having a period of T.

Accordingly, the adaptive clock 7 output by the variable frequency divider 500 has a period that corresponds to the smallest integer multiple of the period of the reference clock 1 but is longer than the critical path delay.

By using the counter 300, the adaptive clock generating apparatus 10 in accordance with an illustrative embodiment of the present inventive concept can dynamically and effectively calculate the best clock cycle period depending on variation of the critical path delay without requiring a complicated circuit.

Figure 5:
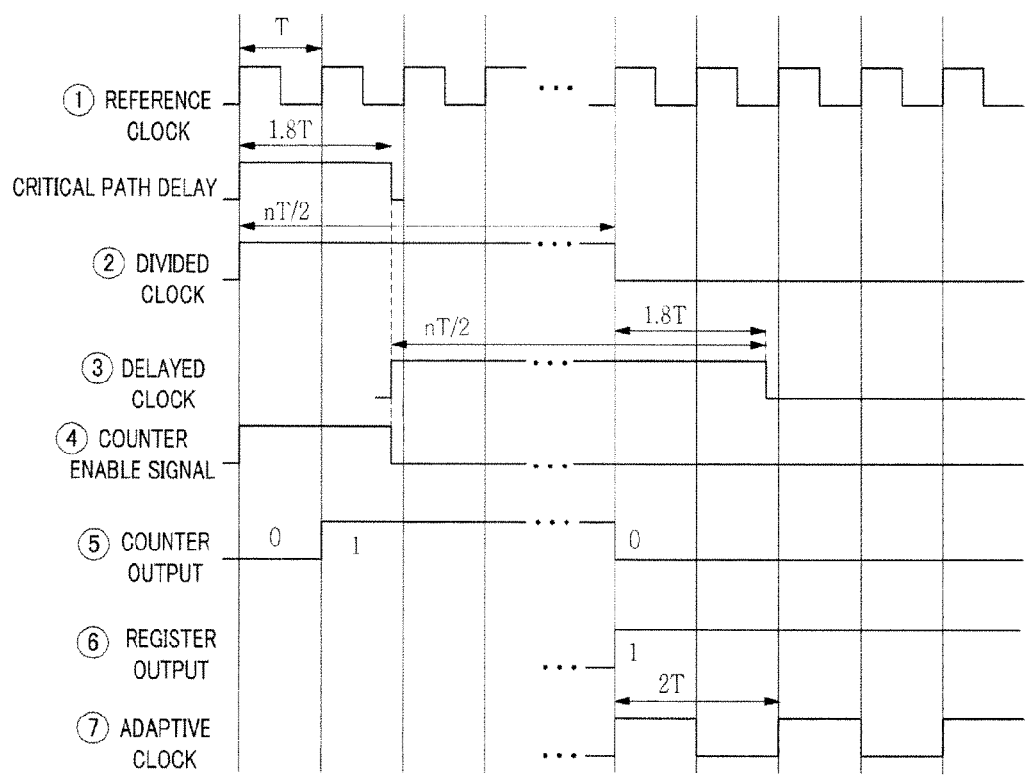
FIGS. 5 and 6 illustrate timing diagrams of FIGS. 2 and 3 in details.
Figure 6:
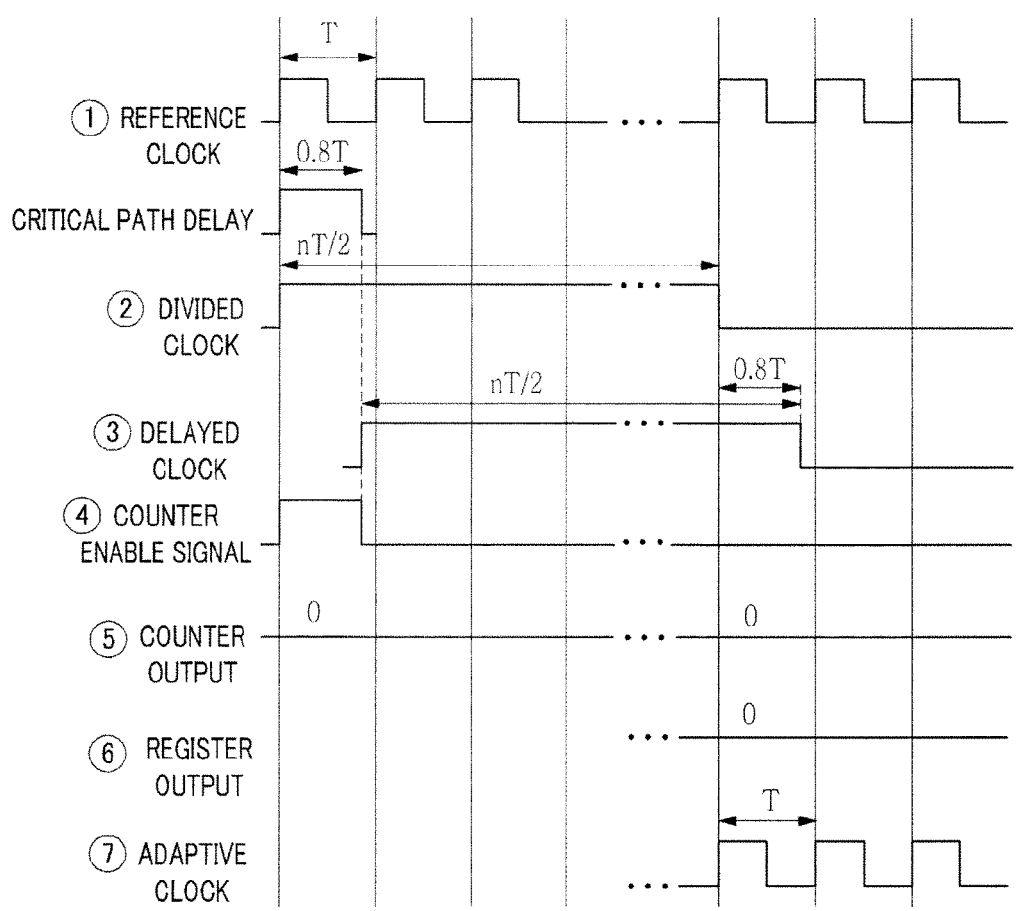

FIGS. 5 and 6 illustrate timing diagrams of FIGS. 2 and 3 in details. With reference to the diagrams, it will be explained again how the adaptive clock generating apparatus in accordance with an illustrative embodiment of the present inventive concept calculates the adaptive clock 7 having the best period based on the operation situation.

First, FIG. 5 illustrates the case where the critical path delay of the synchronous circuit 20 is 1.8T.

The reference clock 1 having a period of T is input to the fixed frequency divider 100. The fixed frequency divider 100 outputs the divided clock 2 having a period of nT. The replica 200 receives the divided clock 2 and outputs the divided clock 2 after lapse of 1.8T corresponding to the critical path delay of the synchronous circuit 20. This is the delayed clock 3. Accordingly, as illustrated, the duration from the ascent edge to the descent edge of the divided clock 2 and the delayed clock 3 are the same which is nT/2.

As described above, by using these two signals to generate the enable signal of the counter, the adaptive clock generating apparatus 10 in accordance with an illustrative embodiment of the present inventive concept can count how many cycles of the reference clock 1 the critical path delay of the synchronous circuit 20 exceeds. That is, the counter enable signal 4 enables the counter 300 to perform the counting function only for 1.8T that corresponds to the critical path delay. During that time, there are two ascent edges of the reference clock 1, i.e., two synchronizing points of time in the illustrated example. Accordingly, the counter stores 0 and 1 in turn.

After the lapse of the critical path delay, i.e., when the counter enable signal 4 falls to 0 at the ascent edge of the delayed clock 3, the counter no longer counts the number of the ascent edges of the input clock. Accordingly, the counter 300 still holds 1.

Thereafter, the counter 300 at the descent edge of the divided clock 2 stores 1 in the register 400, and is reset to 0.

Accordingly, a divider input 6 that is input to the variable frequency divider becomes 1. The cycle of the adaptive clock 7 output by the variable frequency divider 500 becomes 2T.

FIG. 6 wherein the critical path delay of the synchronous circuit 20 is 0.8T is subject to the same operation as described above.

The divided clock 2 and the delayed clock 3 are ascent and descent with a time difference of 0.8T from each other. Since the counter 300 is enabled only for 0.8T, the counter 300 continuously stores 0. Accordingly, the value stored in the register 400 at the time of the reset of the counter 300 becomes 0.

Accordingly, the divider input 6 to the variable frequency divider 500 becomes 0. The period of the adaptive clock 7 output by the variable frequency divider 500 becomes T.

Figure 7:
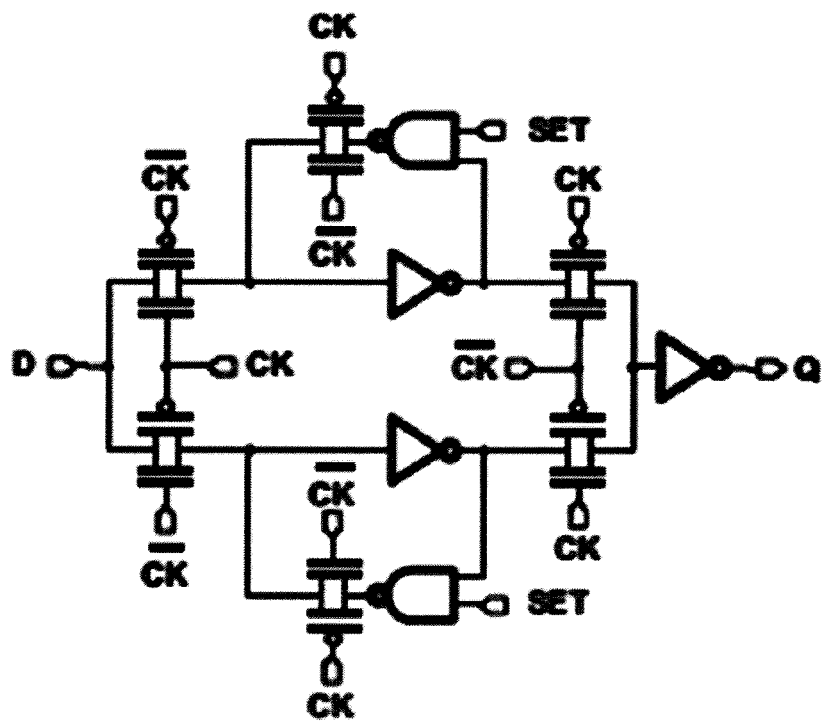
FIG. 7 illustrates a flip-flop used in a variable frequency divider in accordance with an illustrative embodiment of the present inventive concept.

FIG. 7 illustrates a flip-flop used in a variable frequency divider 500 in accordance with an illustrative embodiment of the present inventive concept.

In general, conventional variable frequency dividers cannot output a clock having a 50% duty cycle when a clock corresponding to an odd-number multiple of the input clock period should be output. In an illustrative embodiment of the present inventive concept, a clock having a 50% duty cycle can be output by using a dual-edge triggered counter. That is, the variable frequency divider 500 in accordance with an illustrative embodiment of the present inventive concept uses a dual-edge triggered D-type flip-flop. Since the dual-edge triggered D-type flip-flop is well known, detailed explanation thereof is omitted.

Figure 8:
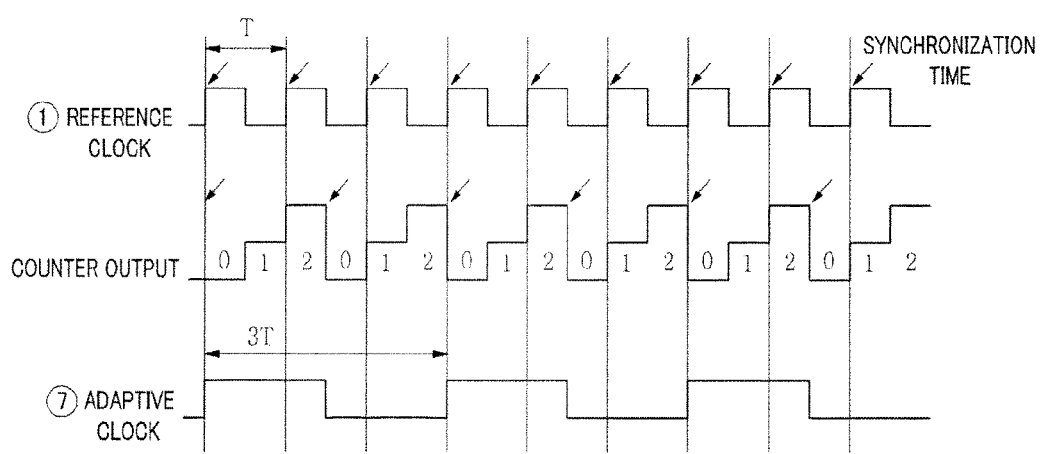
FIG. 8 illustrates a timing diagram of an example variable frequency divider in accordance with an illustrative embodiment of the present inventive concept.

FIG. 8 illustrates a timing diagram of an example variable frequency divider in accordance with an illustrative embodiment of the present inventive concept.

With the dual-edge triggered counter, synchronizing is occurred at both the ascent edges and the descent edges of the input clock. In the illustrated example, since the input clock is the reference clock 1, it is synchronized each T/2.

In the case where the input value D is 2, the counter repeatedly outputs 0, 1, 2, 0, 1, 2, at each synchronizing point. That is, the remainders of division by D+1, which is 3 in this case, are repeated in turn.

By making the signal reversed at the reset point of the counter output, the output clock gets to have a period of 3T. That means that the output clock now has a 50% duty cycle, as illustrated.

Figure 9:
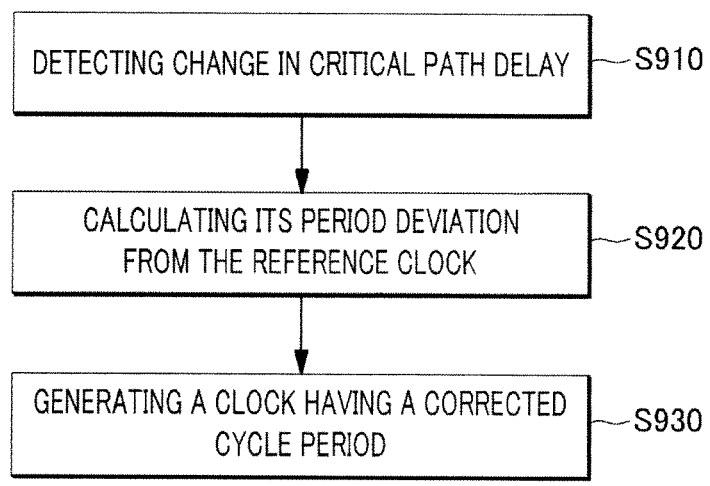
FIG. 9 illustrates a flow of an adaptive clock generating method in accordance with an illustrative embodiment of the present inventive concept.

FIG. 9 illustrates a flow of an adaptive clock generating method in accordance with an illustrative embodiment of the present inventive concept.

Changes in the critical path delay are detected by using the fixed frequency divider 100 and the critical path delay replica 200 (S910).

A period error between the critical path delay and the reference clock 1 is calculated by using the changes in the critical path delay detected in the detection step 5910 as the enable signal applied to the counter 300.

The adaptive clock 7 whose period is corrected is generated by using the variable frequency divider 500 with the period error calculated in the calculation step S920.

Since the foregoing steps have been explained in detail, further explanation thereof is omitted.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a divided manner. Likewise, components described to be divided can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

What is claimed is:

1. An adaptive clock generating apparatus comprising:
  a fixed frequency divider that receives a reference clock, and outputs a clock signal having a period corresponding to an integer multiple of the period of the reference clock;
  a replica that receives the clock signal output by the fixed frequency divider, and outputs a clock signal that is delayed as long as critical path delay of a synchronous circuit;
  a counter that receives an enable signal and a reset signal, which are generated based on the signals output by the fixed frequency divider and the replica, further receives the reference clock as its clock signal, and counts the number of cycles of the reference clock while the counter is enabled; and
  a variable frequency divider that, based on the number of cycles of the reference clock, generates a clock signal having a period corresponding to an integer multiple of the number of cycles of the reference clock, the integer being greater by 1 than the number of cycles of the reference clock,
  wherein the adaptive clock generating apparatus generates a clock whose period varies along with changes in the critical path delay of the synchronous circuit.

2. The adaptive clock generating apparatus of claim 1, wherein the clock generated by the adaptive clock generating apparatus has a period that corresponds to the smallest integer multiple of the period of the reference clock but is longer than the critical path delay, and is applied to the synchronous circuit as its clock signal instead of the reference clock.

3. The adaptive clock generating apparatus of claim 1, wherein the counter counts the number of cycles of the reference clock during the critical path delay based on either the ascent edges or the descent edges of the reference clock.

4. The adaptive clock generating apparatus of claim 1, wherein the enable signal applied to the counter is generated by NOR operation of the inverted output of the fixed frequency divider and the output of the replica.

5. The adaptive clock generating apparatus of claim 1, wherein the reset signal applied to the counter is generated by AND operation of the inverted output of the fixed frequency divider and the output of the replica.

6. The adaptive clock generating apparatus of claim 1, wherein the counter is enabled at an ascent edge of the output signal of the fixed frequency divider and remains enabled during the critical path delay.

7. The adaptive clock generating apparatus of claim 1, wherein the counter is reset at a descent edge of the output signal of the fixed frequency divider.

8. The adaptive clock generating apparatus of claim 1, wherein the variable frequency divider comprises a dual-edge triggered counter.

9. The adaptive clock generating apparatus of claim 1, further comprising a register that stores the number of cycles output by the counter.

10. An adaptive clock generating method, the method comprising:
  (a) detecting changes in critical path delay of a synchronous circuit based on a reference clock;
  (b) counting the number of cycles of the reference clock during the critical path delay to determine how many cycles of the reference clock spent on the critical path delay; and
  (c) based on the number of cycles of the reference clock, generating a clock signal having a period corresponding to an integer multiple of the period of the reference clock, the integer being greater by 1 than the number of cycles of the reference clock,
  wherein the adaptive clock generating method generates a clock whose period varies along with changes in the critical path delay of the synchronous circuit.

11. The adaptive clock generating method of claim 10, further comprising applying the generated clock to the synchronous circuit as its clock signal.

12. The adaptive clock generating method of claim 10, wherein the clock generated by the adaptive clock generating method has a period that corresponds to the smallest integer multiple of the period of the reference clock but is longer than the critical path delay.

\* \* \* \* \*